United States Patent
Zhou et al.

(10) Patent No.: US 11,313,925 B2
(45) Date of Patent: Apr. 26, 2022

(54) QUANTUM SENSOR BASED ON RARE-EARTH-ION DOPED OPTICAL CRYSTAL AND USE THEREOF

(71) Applicant: University of Science and Technology of China, Anhui (CN)

(72) Inventors: Zongquan Zhou, Anhui (CN); Yu Ma, Anhui (CN); Tao Tu, Anhui (CN); Chuanfeng Li, Anhui (CN); Guangcan Guo, Anhui (CN)

(73) Assignee: University of Science and Technology of China, Anhui (CN)

( * ) Notice: Subject to any disclaimer, the term of this patent is extended or adjusted under 35 U.S.C. 154(b) by 486 days.

(21) Appl. No.: 16/491,702

(22) PCT Filed: Nov. 14, 2017

(86) PCT No.: PCT/CN2017/110863
§ 371 (c)(1),
(2) Date: Sep. 6, 2019

(87) PCT Pub. No.: WO2019/095102
PCT Pub. Date: May 23, 2019

(65) Prior Publication Data
US 2020/0072915 A1 Mar. 5, 2020

(51) Int. Cl.
*G01N 21/65* (2006.01)
*G01R 33/12* (2006.01)
(Continued)

(52) U.S. Cl.
CPC ........ *G01R 33/1284* (2013.01); *G01N 21/65* (2013.01); *G01R 33/032* (2013.01);
(Continued)

(58) Field of Classification Search
CPC ........ G02F 1/13; G02F 1/1337; G02F 1/1347; G02F 1/137; G01N 21/65; G01N 21/658;
(Continued)

(56) References Cited

U.S. PATENT DOCUMENTS 9,351,651 B2   5/2016 Nagasaka
9,442,071 B2 * 9/2016 Barcelo ............... G01N 21/658
(Continued)

FOREIGN PATENT DOCUMENTS

| CN | 103941199 | 7/2014 |
| CN | 104704375 | 6/2015 |
| CN | 105674982 | 6/2016 |

OTHER PUBLICATIONS

Maze et al., "Nanoscale magnetic sensing with an individual electronic spin in diamond", Nature (2008) 455:644-648.
(Continued)

*Primary Examiner* — Alesa Allgood
(74) *Attorney, Agent, or Firm* — Fish & Richardson P.C.

(57) ABSTRACT

Provided is a quantum sensor based on a rare-earth-ion doped optical crystal, having: a rare-earth-ion doped optical crystal; a low temperature providing unit, which provides a low temperature operating environment to the rare-earth-ion doped optical crystal; a constant magnetic field generation unit, which applies a constant magnetic field to the rare-earth-ion doped optical crystal; a light field generation unit, which provides a light field performing optical pumping on the rare-earth-ion doped optical crystal to prepare the rare-earth-ions in an initial spin state, and a light field for exciting Raman scattering of the rare-earth-ion doped optical crystal; a pulsed magnetic field generation unit, which applies a pulsed magnetic field perpendicular to the constant magnetic field to the rare-earth-ion doped optical crystal to make the rare-earth-ion doped optical crystal generate a spin echo; and a heterodyne Raman scattering light field detection and
(Continued)

analysis unit, which detects and analyzes a Raman scattering light field radiated from the rare-earth-ion doped optical crystal. Further provided are uses of this quantum sensor for magnetic field sensing and electric field sensing as well as a sensing method.

14 Claims, 4 Drawing Sheets

(51) Int. Cl.
  *G01R 33/032* (2006.01)
  *H01S 3/16* (2006.01)
  *G01R 33/07* (2006.01)

(52) U.S. Cl.
  CPC .......... *H01S 3/1608* (2013.01); *H01S 3/1611* (2013.01); *H01S 3/1613* (2013.01); *H01S 3/1616* (2013.01); *G01R 33/07* (2013.01)

(58) Field of Classification Search
  CPC .......... G01N 2021/655; G01R 33/1284; G01R 33/07; H01S 3/1608; H01S 3/1611; H01S 3/1613; H01S 3/1616; G01J 3/44
  See application file for complete search history.

(56) References Cited

U.S. PATENT DOCUMENTS

| 10,041,971 | B2 | 8/2018 | Grinolds et al. |
| 2009/0272887 | A1* | 11/2009 | Fatemi ............ H05H 3/04 250/251 |
| 2012/0164745 | A1* | 6/2012 | Fu ............ H01F 1/0063 436/164 |

OTHER PUBLICATIONS

SIPO, International Search Report for PCT/CN2017/110863 dated Aug. 13, 2018 with English translation.
Weiner et al., "Superradiant Raman laser magnetometer", Applied Physics Letters (2012)101:261107-1-261107-4.
Álvarez et al., "Performance comparison of dynamical decoupling sequences for a qubit in a rapidly fluctuating spin bath," Physical Review A., 2010, 82:042306, 14 pages.
Office Action in German Appln. No. 112017008194.7, dated Feb. 16, 2021, 27 pages (with English Translation).
Fernandez-Gonzalvo et al., "Coherent frequency up-conversion of microwaves to the optical telecommunications band in an Er:YSO crystal," Physical Review A., 2015, 92:062313, 8 pages.

* cited by examiner

QUANTUM SENSOR BASED ON RARE-EARTH-ION DOPED OPTICAL CRYSTAL AND USE THEREOF

TECHNICAL FIELD

This disclosure relates to the field of quantum sensors, and particularly to a quantum sensor based on a rare-earth-ion doped optical crystal and use thereof.

BACKGROUND ART

Measurement of magnetic fields has a long history of development. Human beings have detected the Earth's magnetic field with a compass to achieve orientation as early as 3rd century BC. In modern society, the magnetic field has wider applications, of which typical examples include maglev trains, magnetic storage, medical magnetic resonance imaging, magnetically confined nuclear fusion apparatuses, and the like. Accordingly, human beings have developed various novel precise magnetic field measurement techniques, of which typical examples include superconducting magnetic flux interferometer sensors, Hall-effect sensors, magnetic resistance sensors, magnetic resonance sensors, and the like. These precise magnetic field measurement techniques have been widely used in various fields such as information, engineering, medicine, physics, space science, and the like.

In recent years, along with the development of quantum information technology, a novel magnetic field measurement technique based on quantum interference has been developed. Generally, the coherence of a quantum system is relatively weak and is extremely prone to be disturbed by environmental fluctuations. Therefore, magnetic field sensors based on quantum interference have significantly improved sensitivities compared to conventional Hall probe sensors and the like.

A typical representative of quantum interference type magnetic field sensors is a magnetometer based on nitrogen-vacancy (NV) centers in diamond. The basic principle of this kind of sensor is to utilize the phenomenon of spin echoes, wherein phase evolution caused by an external magnetic field is sensed in the process of spin evolution. At present, magnetic field sensing based on NV centers may achieve a sensitivity of nT or a higher sensitivity, realize magnetic resonance imaging in a microscopic scale, and detect weak magnetic fields generated by a single neuron or protein. Therefore, it has wide application prospects in various fields such as physics, chemistry, life sciences, and the like.

However, there is still a need for a quantum sensor having a higher sensitivity and a wider operating frequency range.

SUMMARY OF THE INVENTION

In one aspect, this disclosure provides a quantum sensor based on a rare-earth-ion doped optical crystal, wherein the quantum sensor comprises:
  a rare-earth-ion doped optical crystal;
  a low temperature providing unit, which provides a low temperature operating environment for the rare-earth-ion doped optical crystal;
  a constant magnetic field generation unit, which applies a constant magnetic field to the rare-earth-ion doped optical crystal;
  a light field generation unit, which provides a light field performing optical pumping on the rare-earth-ion doped optical crystal to prepare rare-earth-ions in an initial spin state, and a light field for exciting Raman scattering of the rare-earth-ion doped optical crystal;
  a pulsed magnetic field generation unit, which applies a pulsed magnetic field perpendicular to the constant magnetic field to the rare-earth-ion doped optical crystal to make the rare-earth-ion doped optical crystal generate a spin echo; and
  a heterodyne Raman scattering light field detection unit, which detects and analyzes a Raman scattering light field excited and radiated from the rare-earth-ion doped optical crystal by an optical heterodyne method.

In one embodiment, the rare-earth-ion doped optical crystal is a crystal of Eu:YSO, Nd:YSO, Er:YSO, Pr:YSO, or Tm:YSO.

In one embodiment, the light field generation unit comprises:
  a laser device, which emits continuous laser; and
  an optical modulator, which modulates the continuous laser emitted from the laser device into a modulated light field.

In one embodiment, the laser device is a narrow-linewidth laser device.

In one embodiment, the optical modulator is an acousto-optic modulator.

In one embodiment, the pulsed magnetic field generation unit comprises:
  a vector microwave generation unit, which generates vector microwave pulses; and
  a microwave radiation coil, which converts the vector microwave pulses to the pulsed magnetic fields.

In one embodiment, the pulsed magnetic field generation unit comprises a dynamical decoupling sequence control apparatus.

In one embodiment, the quantum sensor further comprises a crystal orientation adjustment apparatus.

In one embodiment, the quantum sensor comprises a light path allowing excitation light for Raman scattering to pass through the rare-earth-ion doped optical crystal twice.

In yet another aspect, this disclosure provides use of the quantum sensor mentioned above for magnetic field sensing or electric field sensing.

In yet another aspect, this disclosure provides a method for performing electric field sensing by using the quantum sensor mentioned above, comprising:
  applying a constant magnetic field to the rare-earth-ion doped optical crystal by using the constant magnetic field generation unit,
  applying a temperature of 1 K to 15 K to the rare-earth-ion doped optical crystal by using the low temperature providing unit,
  applying a pumping light field to the rare-earth-ion doped optical crystal by using the light field generation unit so as to prepare rare-earth-ions in an initial spin state,
  placing the rare-earth-ion doped optical crystal in an electric field to be measured,
  generating a spin echo of the rare-earth-ions by using the pulsed magnetic field generation unit,
  applying a light field to the rare-earth-ion doped optical crystal by using the light field generation unit so that Raman scattering of the rare-earth-ion doped optical crystal is excited, and
  detecting and analyzing a Raman scattering light field radiated from the rare-earth-ion doped optical crystal by using the heterodyne Raman scattering light field detection and analysis unit, and calculating the electric field to be measured.

In one embodiment, between the constant magnetic field and a zero first-order Zeeman effect point the direction error is 0.001 degrees or less and the intensity error is 0.005% or less.

In yet another aspect, this disclosure provides a method for performing magnetic field sensing by using the quantum sensor mentioned above, comprising:

applying a constant magnetic field to the rare-earth-ion doped optical crystal by using the constant magnetic field generation unit, applying a temperature of 1 K to 15 K to the rare-earth-ion doped optical crystal by using the low temperature providing unit, applying a pumping light field to the rare-earth-ion doped optical crystal by using the light field generation unit so as to prepare rare-earth-ions in an initial state, placing the rare-earth-ion doped optical crystal in a magnetic field to be measured, generating a spin echo of the rare-earth-ions by using the pulsed magnetic field generation unit, applying a light field to the rare-earth-ion doped optical crystal by using the light field generation unit so that Raman scattering of the rare-earth-ion doped optical crystal is excited, and detecting and analyzing a Raman scattering light field radiated from the rare-earth-ion doped optical crystal by using the heterodyne Raman scattering light field detection and analysis unit, and calculating the magnetic field to be measured.

In one embodiment, the intensity of the constant magnetic field deviates from a zero first-order Zeeman effect point by 0.1% to 5%.

DESCRIPTION OF DRAWINGS

In order to illustrate the technical solutions in Examples of this disclosure more clearly, figures required for describing the examples will be simply introduced below. It is apparent that the figures described below are merely some Examples of this disclosure, and other figures may be further obtained by those of ordinary skill in the art according to these figures without exerting inventive work.

DESCRIPTION OF EMBODIMENTS

The technical solutions in Examples of this disclosure will be described clearly and fully below in conjunction with accompanying drawings in Examples of this disclosure. Obviously, the Examples described are merely a part of the Examples of this disclosure, rather than all of the Examples. Based on the Examples of this disclosure, all other Examples obtained by those of ordinary skill in the art without performing inventive work belong to the scope protected by this disclosure.

According to the basic concept of this disclosure, there is provided a quantum sensor based on a rare-earth-ion doped optical crystal, comprising:

a rare-earth-ion doped optical crystal;

a low temperature providing unit, which provides a low temperature operating environment to the rare-earth-ion doped optical crystal;

a constant magnetic field generation unit, which applies a constant magnetic field to the rare-earth-ion doped optical crystal;

a light field generation unit, which provides a light field performing optical pumping on the rare-earth-ion doped optical crystal to prepare rare-earth-ions in an initial spin state, and a light field for exciting Raman scattering of the rare-earth-ion doped optical crystal;

a pulsed magnetic field generation unit, which applies a pulsed magnetic field perpendicular to the constant magnetic field to the rare-earth-ion doped optical crystal to make the rare-earth-ion doped optical crystal generate a spin echo; and a heterodyne Raman scattering light field detection and analysis unit, which detects and analyzes a Raman scattering light field excited and radiated from the rare-earth-ion doped optical crystal by an optical heterodyne method.

With the settings described above, a quantum sensor is constructed. This quantum sensor may achieve the measurement of a magnetic field, an electric field, and the like with a high sensitivity by using a rare-earth-ion doped optical crystal as a probe, obtaining an initial spin state of rare-earth-ions by an optical pumping effect, generating a spin echo by magnetic resonance, exciting Raman spectrum by using an excitation light, and performing analysis in a reading manner of optical Raman heterodyne detection. It may be used for magnetic field sensing, electric field sensing, pressure sensing, and the like.

Parameters of elements in this apparatus will be introduced by exemplifying specific numeric values in embodiments of this disclosure. It is to be indicated that the numeric values of the parameters of the elements exemplified here are only for the purpose of understanding this disclosure, rather than setting limitations. In practical use, users may employ elements having different parameters according to requirements or experiences.

Figure 1:
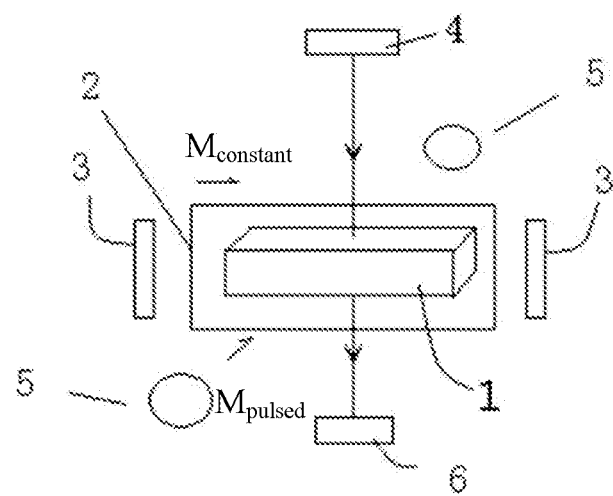
FIG. 1 is a schematic principle diagram of an Example of a quantum sensor of this disclosure.

FIG. 1 is a schematic principle diagram of an embodiment of a quantum sensor of this disclosure.

The quantum sensor of this disclosure comprises a rare-earth-ion doped optical crystal 1. In operation, the rare-earth-ion doped optical crystal 1 is provided in a low temperature environment provided by a low temperature providing unit 2 and in a constant magnetic field $M_{constant}$ generated by a constant magnetic field generation unit 3. The form and the position of the low temperature providing unit 2 herein are only schematic, as long as a desired low temperature may be provided to the rare-earth-ion doped optical crystal 1 in practical use. The low temperature providing unit may be a low temperature chamber. Additionally, the low temperature providing unit and the constant magnetic field generation unit may be integrated in a low temperature constant magnetic field generation unit. In the constant magnetic field $M_{constant}$, the energy level of the nuclear spin of rare-earth-ions in the rare-earth-ion doped optical crystal will split. At this time, by means of applying a pulsed magnetic field $M_{pulsed}$ with specific frequency, phase and amplitude, of which the direction is perpendicular to $M_{constant}$, to the rare-earth-ion doped optical crystal 1 by a pulsed magnetic field generation unit 5, nuclear spin of rare-earth-ions in an excited spin state may be prepared if the frequency of the pulse is resonant with spin transitions of the ions. A spin echo may be generated by setting the pulsed magnetic field $M_{pulsed}$. If the rare-earth-ion doped optical crystal is disturbed (for example, by applying a disturbing magnetic field, a disturbing electric field, and the like), the phase of the spin echo will also change correspondingly. This change may be analyzed by optical detection. Specifically, a modulated light field is applied to the rare-earth-ion doped optical crystal 1 by a light field generation unit 4, and the rare-earth-ion doped optical crystal 1 in an initial spin state is prepared by pumping. Rare-earth-ions in an initial spin state will generate a spin echo after excited by a pulsed magnetic field. When a spin echo is emitted, a single-frequency pumping light field pulse is applied, so that the rare-earth-ion doped optical crystal 1 will generate a Raman scattering light field, which is detected by a heterodyne Raman scattering light field detection unit 6. The spin echo of nucleus will be obtained by demodulation analysis based on the detected Raman light field. For example, by performing comparison with data of undisturbed sensors and calculation, information on the change in disturbance may be obtained, so as to accomplish sensing.

Rare-Earth-Ion Doped Optical Crystal

The rare-earth-ion doped optical crystal 1 is used as a sensing probe of a quantum sensor in this disclosure. The rare-earth-ion doped optical crystal refers to an optical crystal containing rare-earth-ions, wherein the rare earth elements refers to lanthanide series in the periodic table of chemical elements as well as yttrium (Y) and scandium (Sc). The optical crystal may be any crystal, which is transparent to the optical detection waveband of this disclosure. The examples thereof may include optical crystals (YSO, YVO, YAG, and the like) doped with various rare-earth-ions (Pr, Eu, Nd, Eu, Yb, Er, and the like). The inventors of this invention have found that the rare-earth-ion doped optical crystal is particularly suitable to be used as a probe of a quantum sensor. Without relying on any particular theory, the inventors consider that this is related to the long coherence time of rare-earth-ions in the rare-earth-ion doped optical crystal. The long coherence time enables rare-earth-ions to be capable of detecting varying magnetic fields and electric fields in a low frequency regime, so as to improve sensing sensitivity and extend the operating frequency and applications of the sensors.

In a specific sensor, the rare-earth-ion doped optical crystal 1 may be provided in a crystal orientation adjustment apparatus so as to adapt to the angle of the magnetic field or the light field flexibly. By adjusting the angle of crystal orientation to a specific magnetic field and light field, the coherence time of spin states of rare-earth-ions may be significantly elongated, thus improving the sensing sensitivity. A specific operation method may comprise performing a spin echo test under different crystal orientations to obtain information on the coherence time and continuously adjusting the crystal orientation until the longest coherence time is obtained.

The shape and the size of the rare-earth-ion doped optical crystal used may vary according to specific applications. Generally, a flake-like optical crystal is used. The thickness is preferably 1 mm or less so as to improve the spatial resolution of quantum sensing.

The concentration of rare-earth-ions in the crystal may be any proper concentration, and is not particularly limited in this disclosure.

As schematically shown in FIG. 1, the excitation light may be incident from a side of the rare-earth-ion doped optical crystal, and the Raman scattering light field is detected on the other side. However, it is also possible that the excitation light has passed through the optical crystal and thereafter is reflected to pass through the optical crystal again, and then the Raman scattering light field is detected. In view of effectively increasing the signal intensity of the Raman light field and for the convenience of the installation in a practical apparatus, it is preferable to allow excitation light to pass through the optical crystal twice by means of light path design.

Rare-Earth-Ion Doped Optical Crystal Low Temperature Providing Unit

The rare-earth-ion doped optical crystal low temperature providing unit 2 provides a low temperature operating environment for the rare-earth-ion doped optical crystal. Typically, it may be a low temperature chamber unit wherein a rare-earth-ion doped optical crystal is held therein. The object of providing low temperature is to minimize the influence to detection results caused by interference factors such as lattice vibration and the like. Typically, a temperature in a range of 1 K to 15 K may be provided.

Constant Magnetic Field Generation Unit

The constant magnetic field generation unit 3 applies a constant magnetic field to the rare-earth-ion doped optical crystal. The constant magnetic field applied makes the spins of the rare-earth-ions precess about it and splits energy levels. The constant magnetic field applied is selected according to different purposes of sensing.

In FIG. 1 for schematically indicating the principle, the constant magnetic field $M_{constant}$ generated by the constant magnetic field generation unit is in the horizontal direction and perpendicular to the direction of incident light. However, it may also be parallel to the direction of the incident light, i.e., in the vertical direction. The relationship between the direction of the constant magnetic field and the direction of the light path is not particularly limited in this disclosure.

The intensity of the constant magnetic field generated by the constant magnetic field generation unit may be adjusted according to different objects to be detected.

In view of effects of noises from the Earth's magnetic field and the environmental field, external magnetic shielding is required for the whole apparatus in applications of high-sensitivity magnetic field sensing on the order of pT.

In the process of magnetic field sensing, the constant magnetic field generation unit preferably applies a magnetic field near the zero first-order Zeeman effect point of the rare-earth-ion doped optical crystal. The so-called zero first-order Zeeman effect (ZEFOZ) herein refers to the first-order response of the nuclear spin transition frequency of rare-earth-ions to an external magnetic field approaches zero in a specific constant magnetic field. For more details of the ZEFOZ effect, see J. J. Longdell, A. L. Alexander, and M. J. Sellar. Characterization of the hyperfine interaction in europium-doped yttrium orthosilicate and europium chloride hexahydrate. Phys. Rev. B 74, 195101 (2006) as well as other publications in the field. When rare-earth-ions are at the ZEFOZ points, they have the longest coherence time, which is much higher compared to the case where they are far away from those points. Although the coherence time of the probe is long at the ZEFOZ points, the magnetic field response is poor. Therefore, although the detection of ultra-low frequency signals may be achieved, the sensitivity is not high. In the case of deviating from ZEFOZ points, though the coherence time of the probe is somewhat shortened, the magnetic field response becomes significantly stronger, thus improving the practical detection sensitivity. In the case of further deviating from ZEFOZ points, the coherence time of the probe is much shortened, and although the magnetic response becomes even stronger, the practical detection sensitivity will decrease. By optimizing the magnitude and the orientation of the constant magnetic field, the rare-earth-ion doped optical crystal may finally work near the ZEFOZ points so as to both elongate the coherence time of the probe and achieve sensitive detection of signal of a low-frequency magnetic field. Preferably, with respect to a low frequency magnetic field to be measured with a frequency of about 0.01 Hz to 1 Hz, the sensor of this disclosure works well in a range deviating from the ZEFOZ points by 0.1% to 5%, and preferably no greater than 2% in intensity and no greater than 0.02 degrees in the direction. With respect to detection of a magnetic field with a relatively high frequency, there is no such limit. The constant magnetic field with the best sensitivity may be found by a person skilled in the art according to specific probes and environments.

When electric field sensing is performed, the constant magnetic field is optimally at stringent ZEFOZ points. The "stringent" stated herein refers to the requirement that between the constant magnetic field orientation and the ZEFOZ magnetic field the direction error is 0.001 degrees or less and the intensity error is 0.005% or less. The magnetic field in this range belongs to the zero first-order Zeeman effect point. At this time, nuclear spins of rare-earth-ions have the longest coherence time, and the dependency of the response of the electric field on the constant magnetic field is relatively small. Therefore, the sensor will have the optimal sensitivity.

With respect to a specific rare-earth-ion doped crystal, the method for finding the ZEFOZ points thereof is well known in the art. For example, see J. J. Longdell, A. L. Alexander, and M. J. Sellar. Characterization of the hyperfine interaction in europium-doped yttrium orthosilicate and europium chloride hexahydrate. Phys. Rev. B 74, 195101 (2006).

The constant magnetic field generation unit may be integrated to the low temperature providing unit.

Pulsed Magnetic Field Generation Unit

The pulsed magnetic field generation unit 5 applies a pulsed magnetic field, which is perpendicular to the constant magnetic field, to the rare-earth-ion doped optical crystal. Herein, the "pulsed magnetic field" refers to a magnetic field with a specific frequency, phase, and amplitude so that the spin of rare-earth-ions may be flipped by it. In the schematic FIG. 1, the arrow of $M_{pulsed}$ does not mean that the pulsed magnetic field is unidirectional. $M_{pulsed}$ may be in an opposite direction, or may represent a combination of pulse sequences. A spin echo sequence as well known in the art enables a 90° lateral rotation of the nuclear spin by a first pulsed magnetic field, and then enables another 180° flip-over of the nuclear spin by the second pulsed magnetic field. By the action of the pulsed magnetic field, the rare-earth-ion doped optical crystal will generate a spin echo in the process of spin evolution. "Spin evolution" refers to spontaneous Larmor precession of spin states of rare-earth-ions under an external magnetic field environment. A "spin echo" refers to a phenomenon that coherent convergence of spins of the rare-earth-ions occurs under control of a pulsed magnetic field to emit an echo. Both of the terms have the meanings well known in the art. The spin echo may be detected by a light detection unit. The effect of an external magnetic field or an external electric field will change the emission of the spin echo, and is represented by light signals detected by the light detection unit.

The pulsed magnetic field generation unit 5 may comprise: a vector microwave generation unit, which generates vector microwave pulses; and a microwave radiation coil, which converts vector microwave pulses to pulsed magnetic fields. The vector microwave generation unit may generate a microwave pulse with an arbitrary desired frequency, amplitude, and phase. Once this microwave pulse is emitted to a pair of microwave radiation coils oppositely placed, a pulsed magnetic field may be generated in the space inside the coil. The vector microwave emits a finally generated pulsed magnetic field by the microwave radiation coil, the magnitude of the vector microwave determines the intensity of the pulsed magnetic field, and the phase of the vector microwave determines the flip-over direction of the pulsed magnetic field.

The pulsed magnetic field generation unit may also possess other structures, as long as a desired pulsed magnetic field may be provided.

The pulsed magnetic field generation unit 5 may further comprise a dynamical decoupling sequence control apparatus. A "dynamical decoupling sequence" means that a periodic high-speed flip-over of spin states of rare-earth-ions is achieved by periodic microwave sequences so as to elongate further the coherence time and the operating time of the probe. The principle thereof is that the frequency spectrum resolution of external magnetic field detection is improved by the single-frequency filter property of dynamical decoupling. The person skilled in the art may achieve an appropriate dynamical decoupling sequence by a dynamical decoupling sequence control apparatus as needed.

Light Field Generation Unit

The quantum sensor of this disclosure detects and analyzes the spectral change of a spin echo under an external disturbance (such as a magnetic field disturbance or an electric field disturbance) by optical means, so as to deduce this external disturbance. The optical system comprises a light field generation unit 4 and a heterodyne Raman scattering light field detection unit 6.

On the one hand, the light field generation unit 4 may generate a controllable light field, which is applied to the rare-earth-ion doped optical crystal 1 to prepare rare-earth-ions in an initial state by optical pumping. Optical pumping means that the absorption band of rare-earth-ions is manipulated by a controllable laser pulse to make rare-earth-ions stay in a specific energy level. The optical pumping is well known in the art, and may change the distribution of particles in various energy levels. In an Example of this disclosure, the initial state of rare-earth-ions achieved by the optical pumping is an $m_1=+3/2$ fine energy state of the ground state $^7F_0$ energy level of Eu ions. Rare-earth-ions in an initial state are excited by a pulsed magnetic field, and generate a spin echo after evolution. Here, the initialization of spin states of rare-earth-ions may be achieved by using optical pumping so as to improve the signal-to-noise ratio of the signal detection significantly. In order to pump rare-earth-ions at different energy levels to the same energy level state, the light field for generating optical pumping may be a laser, which resonates with transitions to all energy levels except the initial state of interest.

On the other hand, light field generation unit 4 may also generate a light field for exciting Raman scattering, in addition to optical pumping. The light for exciting Raman scattering is typically a single-frequency light.

As an embodiment, the light field generation unit comprises a laser device, which emits continuous laser; and an optical modulator, which modulates the continuous laser emitted from the laser device into a modulated light field. Herein, an "optical modulator" refers to a device achieving control of a light field based on electrical signals, which modulates a continuous laser to a light field with any desired amplitude, frequency, and phase so as to be suitable for the requirements for the initialization of spin states and Raman scattering light detection. For example, the optical modulator may modulate a continuous laser to a swept-frequency laser or a single-frequency laser.

Any type of laser device may be used. Preferably, the laser device is a narrow-linewidth laser device. The narrow-linewidth laser device refers to a continuous laser device having a linewidth lower than 1 MHz. It has the advantages of small drift of laser frequency, significant effect of optical pumping and stable signals after modulation.

Any type of optical modulator may be used. Preferably, the optical modulator is an acousto-optic modulator, particularly a program-controlled acousto-optic modulator. The acousto-optic modulator refers to a device, which modulates laser with acousto-optic Bragg diffraction effect. It has the advantages of high diffraction efficiency and large modulation bandwidth.

The light field generation unit may further comprise other structures, as long as it may provide a desired light field.

The light field generation unit may further comprise auxiliary optical elements, for example beam splitters, mirrors, and the like, for the optimization of the optical system. For example, the light path composed of a beam splitter 43a and a mirror 43b in FIG. 2 enables an excitation light field to enter the rare-earth-ion doped optical crystal twice so as to improve the signal intensity.

Heterodyne Raman Scattering Light Field Detection and Analysis Unit

The heterodyne Raman scattering light field detection and analysis unit 4 detects and analyzes the Raman scattering light field radiated from the rare-earth-ion doped optical crystal by excitation. Herein, "heterodyne Raman scattering light field detection" refers to detection of a Raman scattering light field by using a heterodyne detection method, wherein detection of a magnetic resonance signal is achieved by detection of beat-frequency signals and demodulation of local oscillator microwaves. The optical heterodyne method is a method commonly used in the field of laser measurement. With respect to specific contents of heterodyne Raman scattering light field detection, see J. Mlynek et al., Raman Heterodyne Detection of Nuclear Magnetic Resonance. Phys. Rev. Letts. 50. 993 (1983) as well as other publications in the field. As found by the inventors of this invention, with respect to the rare-earth-ion doped optical crystals of this disclosure, spin echo signals of the rare-earth-ion doped optical crystals cannot be detected if a conventional detection method with a nuclear magnetic resonance spectrometer is used. As further found by the inventors of this invention, high-sensitivity electromagnetic field measurement performed with a rare-earth-ion doped optical crystal may be achieved by using the heterodyne Raman scattering light field detection.

The light field detector in the heterodyne Raman scattering light field detection is a beat-frequency type light field detector. Herein, a "beat frequency" manner means that a Raman scattering light field and a local oscillator light field are combined in a photoelectric detector to detect beat frequency signals. The effect thereof is to achieve sensitive detection of a weak Raman scattering light field by using the property of frequency selection.

The heterodyne Raman scattering light field detection and analysis unit may further comprise auxiliary optical elements, for example beam splitters, mirrors, and the like, for the optimization of the optical system.

The quantum sensor of this disclosure may be used for magnetic field sensing and electric field sensing. The electromagnetic field measured is typically an alternating electromagnetic field. The frequency of the electromagnetic field measured may be lower than 1 kHz, and down to 10 mHz. The quantum sensor of this disclosure may also be used to measure a physical quantity, which may be indirectly obtained by measuring an electromagnetic field. For example, the quantum sensor of this disclosure may be used as a pressure sensor, as long as the pressure to be measured may be obtained by conversion to electromagnetic field measurement. A possible way is the use of a device such as a piezoelectric element and the like.

In a specific application, this sensor may be used to test a magnetic field outside a crystal. For example, a disturbing magnetic field was placed under the crystal in the Example. In practical applications, a magnetic field source of interest may be placed on the surface of a crystal; and then the magnitude and frequency of the field to be measured is tested by using the spin echo method or the dynamical decoupling method described above.

This sensor may also be used in detection of a weak magnetic field in a crystal, such as kinetic analysis of Y (yttrium) spin or other magnetic foreign matters in a crystal. In such a case, dynamical decoupling may be performed on rare-earth-ions. The frequency spectrum of the environmental magnetic field inside the crystal is analyzed according to the relationship between the magnitude of the echo of dynamical decoupling and the period of the pulse sequence of decoupling.

A method for performing electric field sensing by using the quantum sensor in an Example of this disclosure comprises:

applying a constant magnetic field to the rare-earth-ion doped optical crystal by using the constant magnetic field generation unit, applying a temperature of 1 K to 15 K to the rare-earth-ion doped optical crystal by using the low temperature providing unit, applying a pumping light field to the rare-earth-ion doped optical crystal by using the light field generation unit so as to prepare rare-earth-ions in an initial spin state, placing the rare-earth-ion doped optical crystal in an electric field to be measured, generating a spin echo of the rare-earth-ions by using the pulsed magnetic field generation unit, applying a light field to the rare-earth-ion doped optical crystal by using the light field generation unit so that Raman scattering of the rare-earth-ion doped optical crystal is excited, and detecting and analyzing a Raman scattering light field radiated from the rare-earth-ion doped optical crystal by using the heterodyne Raman scattering light field detection and analysis unit, and calculating the electric field to be measured.

As discussed above, in electric field measurement, it is preferable that between the constant magnetic field and a ZEFOZ point the direction error is 0.001 degrees or less and the intensity error is 0.005% or less.

A method for performing magnetic field sensing by using the quantum sensor in an Example of this disclosure comprises:

applying a constant magnetic field to the rare-earth-ion doped optical crystal by using the constant magnetic field generation unit, applying a temperature of 1 K to 15 K to the rare-earth-ion doped optical crystal by using the low temperature providing unit, applying a pumping light field to the rare-earth-ion doped optical crystal by using the light field generation unit so as to prepare rare-earth-ions in an initial state, placing the rare-earth-ion doped optical crystal in a magnetic field to be measured, generating a spin echo of the rare-earth-ions by using the pulsed magnetic field generation unit, applying a light field to the rare-earth-ion doped optical crystal by using the light field generation unit so that Raman scattering of the rare-earth-ion doped optical crystal is excited, and detecting and analyzing a Raman scattering light field radiated from the rare-earth-ion doped optical crystal by using the heterodyne Raman scattering light field detection and analysis unit, and calculating the magnetic field to be measured.

As discussed above, in low frequency magnetic field measurement with respect to 0.01 Hz to 1 Hz, it is preferable that the constant magnetic field is near the ZEFOZ points, and more preferably deviates from the ZEFOZ points by 0.1% to 5%.

This invention will be further described in detail below by Examples.

EXAMPLE 1

Quantum Sensor Based on Rare-Earth-Ion Doped Optical Crystals

Figure 2:
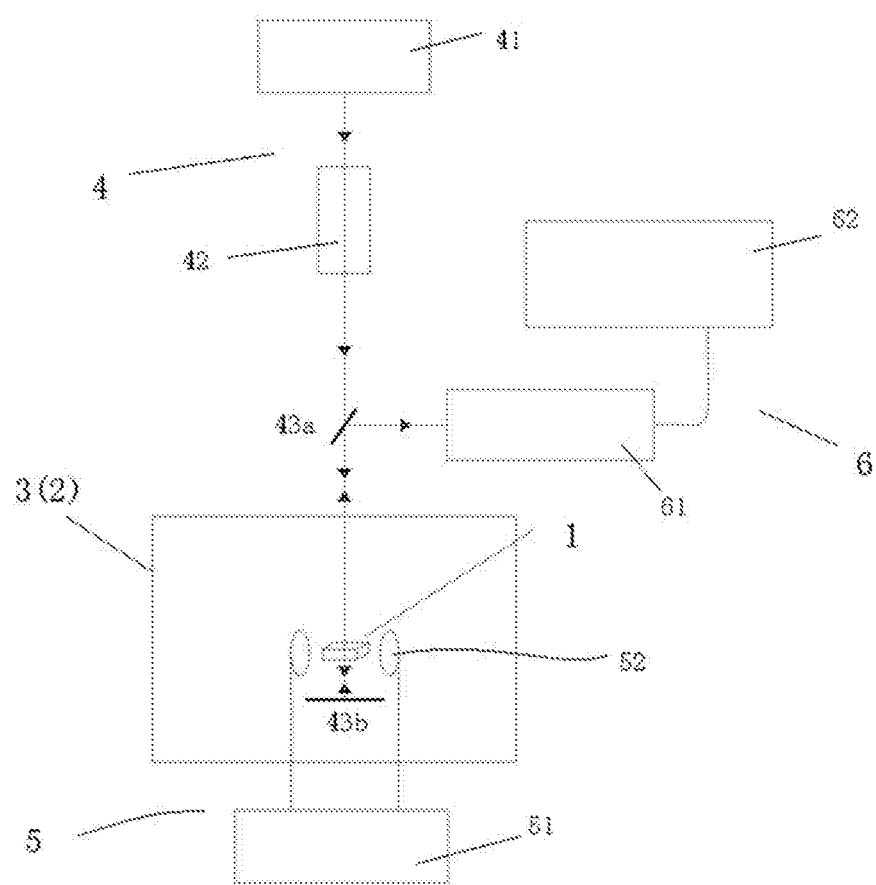
FIG. 2 is a schematic diagram of an apparatus in an Example of a quantum sensor based on a rare-earth-ion doped optical crystal of this disclosure.

FIG. 2 is a schematic diagram of an apparatus in an Example of a quantum sensor based on a rare-earth-ion doped optical crystal. As shown in FIG. 2, this apparatus mainly comprises the following parts:

a rare-earth-ion doped optical crystal 1, a low temperature providing unit 2, a constant magnetic field generation unit 3, a light field generation unit 4, a pulsed magnetic field generation unit 5, and a heterodyne Raman scattering light field detection and analysis unit 6.

Here, the rare-earth-ion doped optical crystal unit 1 is used to achieve detection of an electromagnetic field and generates sensing signals.

The low temperature providing unit 2 provides a low temperature operating environment to the rare-earth-ion doped optical crystal.

The constant magnetic field generation unit 3 is used to apply a constant magnetic field. The constant magnetic field generation unit 3 may be integrated to the low temperature providing unit 2.

The light field generation unit 4 is used to achieve preparation of initial states of spins of rare-earth-ions by optical pumping so as to improve the signal-to-noise ratio of nuclear magnetic resonance detection; and is further used to excite a Raman scattering light field.

The pulsed magnetic field generation unit 5 is used to apply a pulsed magnetic field with any amplitude and phase.

The heterodyne Raman scattering light field detection and analysis unit 6 is used to perform optical detection and analysis on spin echo signals of the rare-earth-ion doped optical crystal by detecting the Raman spectrum.

Further, the rare-earth-ion doped optical crystal unit 1 may be mounted on a crystal orientation adjustment apparatus such as a sample rotator. The sample rotator is used to rotate a sample arbitrarily so as to obtain an equivalent arbitrary magnetic field direction. The parameters thereof may include biaxial arbitrary rotatability, 1 milidegree rotation precision, and 360° rotatability.

Here, the rare-earth-ion doped optical crystal 1 is used to be receive microwave excitation from a microwave radiation coil 52 to generate a spin echo and acquires a phase caused by an external magnetic field in the process of spin evolution. The parameters thereof may include optical crystals (YSO, YVO, YAG, and the like) doped with various rare-earth-ions (Pr, Eu, and the like). In this Example, an Eu ion doped YSO crystal was used, which had an ion concentration of 0.01%, a thickness of 1 mm along the direction of b axis of the crystal, and an anti-reflective film against a wavelength of 580 nm coated on a D1*D2 surface (i.e., the incident surface). In practical applications, it is possible to determine the orientation and the size of the crystal according to the optical absorption depth of the specific rare-earth-ion doped crystal and determine the doping concentration according to the requirements for the coherence time of spin.

The constant magnetic field generation unit 3 provided a direct bias magnetic field environment. In this Example, a low temperature providing unit 2 for cooling was further integrated thereto simultaneously to provide a low-temperature magnetic environment for the rare-earth-ion doped optical crystal 1, and the parameters thereof included a temperature of 2 K and a magnetic field of about 1.28 T.

Further, the pulsed magnetic field generation unit 5 comprised a vector microwave source 51 and a microwave radiation coil 52.

Here, the vector microwave source 51 was used to generate a microwave pulse with arbitrary frequency, amplitude, and phase. In this Example, the parameters thereof may include a frequency range of 1 MHz to 20 GHz, a pulse peak power of 500 W, and a phase precision of 0.1°. In this Example, the frequency was about 12 MHz.

The microwave radiation coil 52 was used to apply a microwave magnetic field onto the rare-earth-ion doped optical crystal. In this Example, the parameters thereof included an 8-turn Helmholtz coil having a coil diameter of 6 mm and wire core diameter of 0.5 mm.

Further, the light field generation unit 4 comprised a laser device 41 and an optical modulator 42.

Here, the laser device 41 was used to generate a continuous laser with a narrow linewidth, which was delivered to the optical modulator 42 for further program controlling. The parameters thereof may include a wavelength of 580 nm, a linewidth of 1 kHz after frequency locking by a Pound-Drever-Hall (PDH) technique, and a power of 600 mW. The reason why the wavelength of the laser was set to be 580 nm was that the optical resonance absorption wavelength of Eu ions in the YSO crystal was 580 nm.

The optical modulator 42 was used to receive a narrow linewidth laser of the laser device 41 so as to generate a pumping light field with arbitrary amplitude, frequency, and phase by modulation or generate a single-frequency laser. The parameter thereof may be an acousto-optic modulator having a center frequency of 250 MHz and a radio-frequency bandwidth of 120 MHz, and the driving source thereof was program-controlled by a computer.

In the light path of this Example, there was a first lens 43a, which was used to transfer the modulated light field emitted by the optical modulator 42 into the rare-earth-ion doped optical crystal and collect reflected light signals. The parameter thereof may be a 50:50 beam splitter.

In the light path of this Example, there was a second lens 43b, which was used to reflect the light path and allow it to pass through the rare-earth-ion doped optical crystal again so as to improve the signal-to-noise ratio. The parameter thereof may be a mirror with a reflectivity of 99.9%.

Further, the heterodyne Raman scattering light field detection and analysis unit 6 comprised a photoelectric detector 61 and demodulation analysis apparatus 62.

Here, the photoelectric detector 61 was used to receive a Raman scattering light field and a reference light field and detect beat frequency signals; wherein the reference light field was a remaining transmitted light field after a pumping light field for exciting Raman scattering passed through a crystal. The parameter of the photoelectric detector may be a silicon-based photoelectric detector with a detection bandwidth of 150 MHz.

The demodulation analysis apparatus 62 was used to demodulate and amplify local oscillator microwave signals and beat frequency signals extracted from the photoelectric detector 61 and store data. The parameters thereof may include a bandwidth of 30 kHz and an amplification factor of 100.

The apparatus in this Example of this disclosure combined the detections of the nuclear spin echo and the electromagnetic field of the rare-earth-ion doped optical crystal to achieve a quantum sensor based on a rare-earth-ion doped optical crystal, and significantly improved the signal-to-noise ratio by means of optical pumping and a Raman heterodyne detection method. The facilities used in the process described above were easy for operation, and the system had a relatively high stability and complete test function.

The use of this disclosure will be described below by exemplifying magnetic field measurement.

EXAMPLE 2

Measurement of External Disturbing Magnetic Field

Magnetic field measurement was performed by using the quantum sensor of Example 1.

Furthermore, in this Example, the zero first-order Zeeman (ZEFOZ) effect was used to elongate the coherence time of Eu ions by providing a constant magnetic field generated by the constant magnetic field generator 3. At a ZEFOZ point (wherein the magnetic field was about 1.28T, and the orientation of the magnetic field in a crystal D1*D2*b coordinate system was [−0.535, −0.634, 0.558]), the coherence time of spin of the ions was about 30 s. The probe had the longest operation time here, and it was suitable for detection of ultra-low frequency signals. However, the sensitivity of magnetic detection is not high due to poor response to the magnetic field. When the magnetic field was higher than the ZEFOZ point by 200 G, i.e., at 1.30 T, the coherence time was measured to be about 1.5 s by using a spin echo. The magnetic field response was good here, so there was a higher sensitivity for magnetic field detection.

When the magnetic field was higher than the ZEFOZ point by 200 G, an external disturbing magnetic field was practically measured based on the spin echo. This disturbing magnetic field was a one-cycle sine wave, and had a function form of $B_{AC}*Sin(1.5\pi t)$, wherein t was time. When the excitation of the spin echo begun, the disturbing magnetic field was synchronously applied. When an echo was generated, the disturbing magnetic field was synchronously finished. This disturbing magnetic field was generated by one a signal source and released by a coil, which was 5 mm below the sensor. This coil had 4 turns and a diameter of 18 mm. The direction of the disturbing magnetic field was consistent with the direction of the constant magnetic field. At room temperature, we determined by using a Hall probe that the relationship between the magnetic field $B_{AC}$ released by this coil at the position of the crystal and the voltage applied V was $B_{AC}/V=0.9\pm0.1$ uT/V. Therefore, the magnitude of the disturbing magnetic field may be estimated by the magnitude of the voltage applied.

Optical pumping was first performed on the probe by the light field generation unit. The method of optical pumping was as follows. A laser of 580 nm was emitted from a laser device. By using an acousto-optic modulator, within a period from 0 s to 4 s, the swept laser frequency was in a range of [−45 MHz, 0 MHz], wherein 0 MHz corresponded to the center frequency 250 MHz of the acousto-optic modulator and −45 MHz corresponded to a light field of which the frequency is lower than the center frequency by 45 MHz. Specifically, with respect to a light field, within the period from 0 s to 1.5 s, the continuously swept laser frequency was −45 MHz to 0 MHz; within the period from 1.5 s to 2 s, the laser frequency was controlled at 0 MHz; and the process of pumping from 0 s to 2 s described above was repeated once within the period from 2 s to 4 s. In this way, the spin state may be prepared into an $m_1=+3/2$ initial state.

Next, from the time of 4.5 s, a pulsed magnetic field was applied to excite the spin echo with a pulse sequence of [90°-180°-echo], and a disturbing magnetic field was applied simultaneously. The total evolution time of the spin echo was 1.332 s, which corresponded to the length of one cycle of the disturbing magnetic field.

At the time of 5.832 s, a light field corresponding to the center frequency 0 MHz was incident to a light pumping unit while the spin echo was emitted, and the spin echo signal was converted to a Raman scattering light field. Through heterodyne Raman scattering light field analysis, the real part X and the imaginary part Y of the spin echo signal were directly shown on an oscilloscope.

Figure 3:
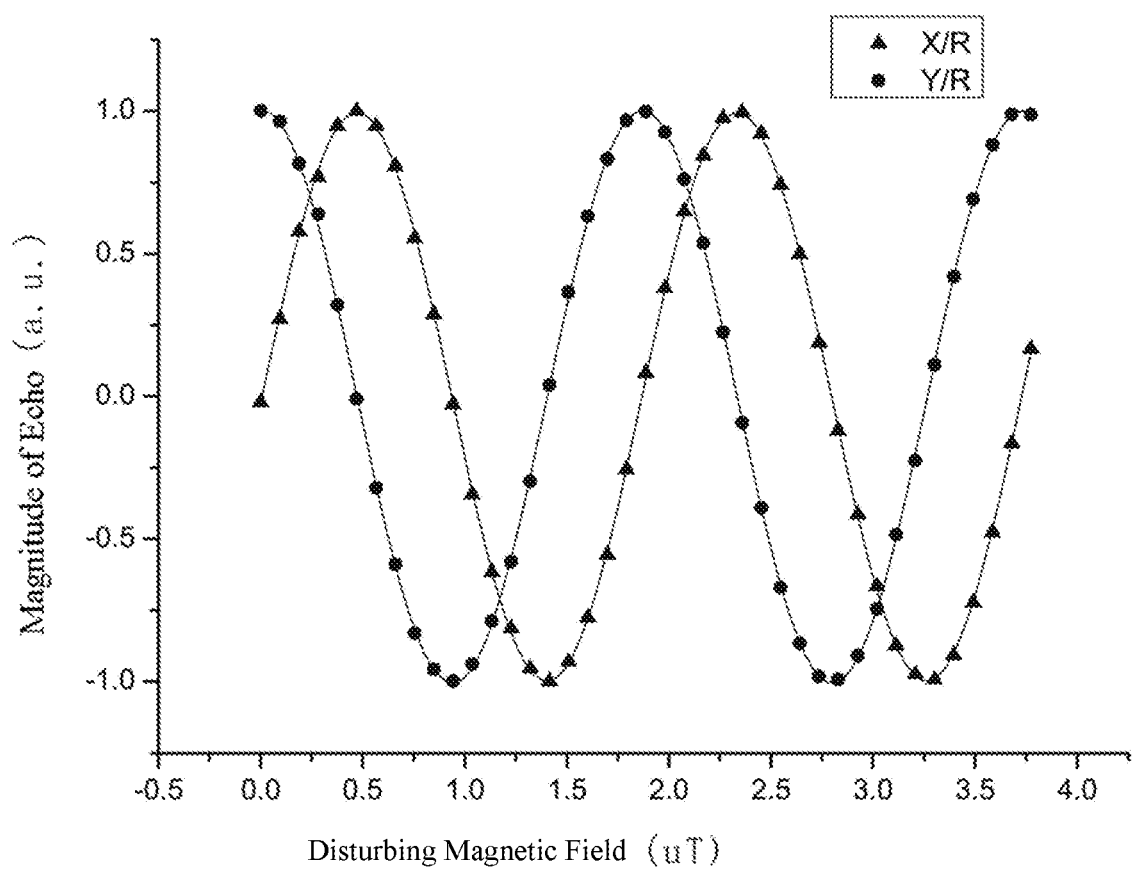
FIG. 3 is a graph of a result of a magnetic field practically measured in an Example of a quantum sensor based on a rare-earth-ion doped optical crystal of this disclosure.

The result of the magnetic field practically measured was as shown in FIG. 3. In the figure, the abscissa was the magnitude of the disturbing magnetic field applied, and the ordinate was the ratio of the real part X and the imaginary part Y of the nuclear spin echo to an amplitude R. The echo evolution time used by each point was 1.332 s. Four measurements were performed, and the average value was taken. Fitting of a standard sine curve was performed according to this experimental result. The average error of fitting was 0.0045, and a corresponding minimum measurable magnetic field was 4.5 nT. Given that the total time of measurement was 5.328 s, the sensitivity of magnetic field measurement was 10.4 nT/√Hz (an operating frequency of 0.75 Hz). As the first rare-earth-ion quantum sensor, this sensitivity had already significantly exceeded the first magnetic field quantum sensor based on NV centers [30 nT/√Hz], see Nature 455.644(2008)].

EXAMPLE 3

Dynamical Decoupling Method

Further, in addition to a simple spin echo method, a complex dynamical decoupling sequence may be further applied to detect an external alternating magnetic field. A "dynamical decoupling sequence" means that a periodic high-speed flip of spin states of rare-earth-ions is achieved by periodic microwave sequences so as to elongate further the coherence time and the operating time of the probe.

In this Example, the specific solution was that a pulsed magnetic field generation unit generated a XY-8 dynamical decoupling sequence. The method of performing this sequence was first applying a 90° pulse and applying the following periodic sequence after an interval of 22.248 ms: X-Y-X-Y-Y-X-Y-X, wherein X corresponded to a 180° pulse in a 0° phase and Y corresponded to a 180° pulse in a 90° phase, and the distance between every two 180° pulses was 44.496 ms. The generated echo was finally detected to extract the phase information caused by the disturbing magnetic field. The frequency response of this method may be observed by sweeping the number of cycles of the disturbing magnetic field.

This method had the advantage that the frequency resolution detected gradually became better as the number of pulses increased, and could be used as a precise spectral analysis technique.

Figure 4:
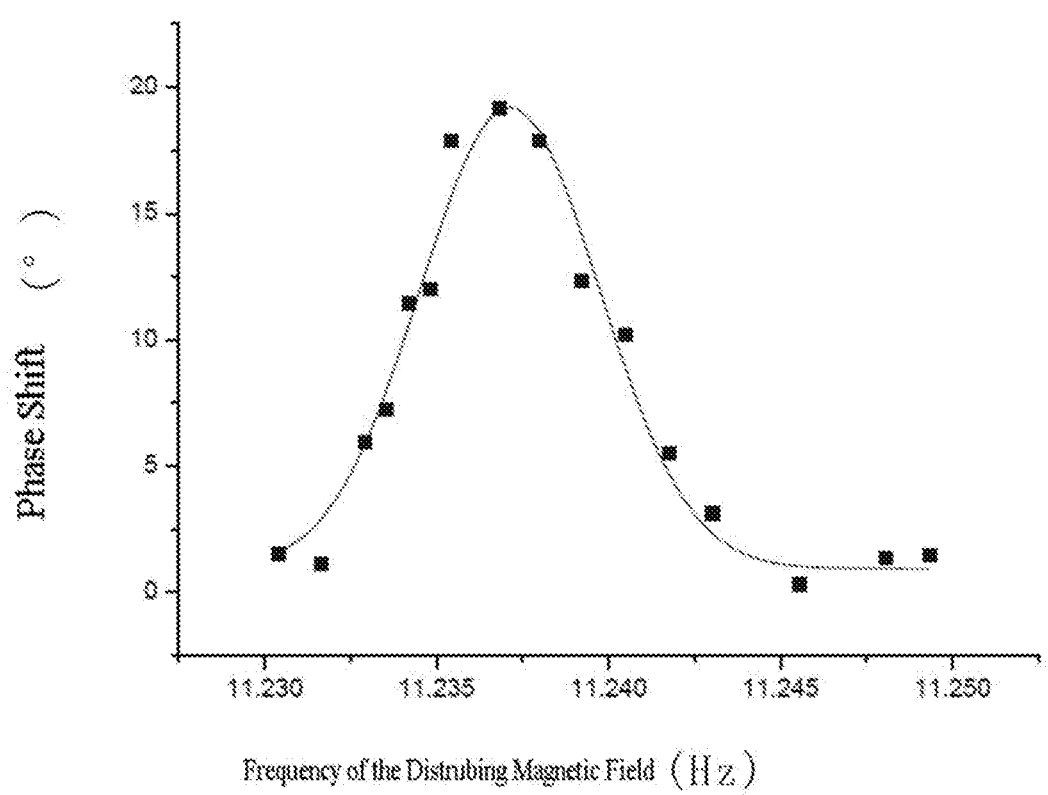
FIG. 4 is a graph of a result of a dynamical decoupling sequence improving the frequency resolution of magnetic field measurement in an Example of this disclosure.

In this Example, when the operating magnetic field was higher than the ZEFOZ point by 6 G, the coherence time practically measured was 16.1 s. At this operating point, the XY-8 dynamical decoupling sequence was performed, and 1280 180° pulses were applied in total. The external alternating magnetic field had a magnitude of 1 uT and a function form of $Sin(2\pi*f*t)$, wherein f was oscillation frequency and t was time. FIG. 4 showed that the magnitude of phase deviation was observed by finely sweeping the frequency f of an external alternating field. As can be seen, the frequency spectrum resolution of this analytical method may be up to the order of 10 mHz.

As can be seen from the Examples described above, it was shown by the practical measurement result of the quantum sensor based on a rare-earth-ion doped optical crystal of this disclosure that the sensitivity of the sensor may be up to 10.4 nT/√Hz at a operating frequency of 0.75 Hz, which was comparable to the property of the most advanced NV-center quantum sensor. Due to the extremely long coherence time inherent to rare-earth-ions, this sensor may be used in analysis of signals in a low frequency range, including a waveband of 0.01 Hz to 100 Hz. In the practical measurement of an alternating magnetic field with a frequency of 11.237 Hz, the frequency spectrum resolution was up to the order of 10 mHz.

The elements of this apparatus are all universal electrical and optical devices. The apparatus has high stability and sensitivity as well as wide operating frequency range, and has a wide application prospect.

Examples 2 and 3 have exemplarily illustrated the method for measuring a magnetic field with the quantum sensor of this disclosure. The quantum sensor of this disclosure may also be used in electric field sensing. Compared to the measurement of a magnetic field, one of the differences in the methods is that the constant magnetic field applied is a stringent ZEFOZ magnetic field.

The quantum sensor of this disclosure may also be used in strain sensing, as long as a device for converting a strain signal to a magnetic field or electric field signal is added. Otherwise, the frequency response may be directly tested when the crystal is pressed.

Other uses of the quantum sensor of this disclosure may also be contemplated by the person skilled in the art.

The quantum sensor of this disclosure may achieve the measurement of a magnetic field, an electric field, and the like with a high sensitivity by using a rare-earth-ion doped optical crystal as a probe, obtaining initial state by optical pumping, generating a spin echo by magnetic resonance, exciting Raman spectrum by using excitation light, and performing analysis read out by optical Raman heterodyne detection. This quantum sensor is easy for operation and has a high stability as well as the characteristic of working in a wide frequency range, and may be widely used in the field of precise measurement.

As can be clearly understood by the person skilled in the art, for the purpose of convenient and simple description, illustration is made only by divisions of various functional modules described above. In practical applications, the functions described above may be contributed, so as to be achieved by different functional modules as needed. That is, the internal structure of the apparatus is divided into different functional modules to achieve all or part of the function.

Objects, technical solutions, and advantageous effects of this disclosure are further illustrated in details by the specific Examples described above. It is to be understood that those described above are merely specific Examples of this disclosure, but are not intended to limit this disclosure. All of modifications, equivalent replacements, improvements, and the like, which are within the spirit and the principle of this disclosure, should be encompassed in the scope protected by this disclosure.

What is claimed is:

1. A quantum sensor based on a rare-earth-ion doped optical crystal, wherein the quantum sensor comprises:
    a rare-earth-ion doped optical crystal;
    a low temperature providing unit, which provides a low temperature operating environment for the rare-earth-ion doped optical crystal;
    a constant magnetic field generation unit, which applies a constant magnetic field to the rare-earth-ion doped optical crystal;
    a light field generation unit, which provides a light field performing optical pumping on the rare-earth-ion doped optical crystal to prepare rare-earth-ions in an initial spin state, and a light field for exciting Raman scattering of the rare-earth-ion doped optical crystal;
    a pulsed magnetic field generation unit, which applies a pulsed magnetic field perpendicular to the constant magnetic field to the rare-earth-ion doped optical crystal to make the rare-earth-ion doped optical crystal generate a spin echo; and
    a heterodyne Raman scattering light field detection and analysis unit, which detects and analyzes a Raman scattering light field radiated from the rare-earth-ion doped optical crystal by an optical heterodyne method.

2. The quantum sensor according to claim 1, wherein the rare-earth-ion doped optical crystal is a crystal of Eu:YSO, Nd:YSO, Er:YSO, Pr:YSO, or Tm:YSO.

3. The quantum sensor according to claim 1, wherein the light field generation unit comprises:
    a laser device, which emits continuous laser; and
    an optical modulator, which modulates the continuous laser emitted from the laser device into a modulated light field.

4. The quantum sensor according to claim 3, wherein the optical modulator is an acousto-optic modulator.

5. The quantum sensor according to claim 3, wherein the laser device is a narrow-linewidth laser device.

6. The quantum sensor according to claim 1, wherein the pulsed magnetic field generation unit comprises:
    a vector microwave generation unit, which generates vector microwave pulses; and
    a microwave radiation coil, which converts the vector microwave pulses to the pulsed magnetic fields.

7. The quantum sensor according to claim 1, wherein the pulsed magnetic field generation unit comprises a dynamical decoupling sequence control apparatus.

8. The quantum sensor according to claim 1, wherein the quantum sensor further comprises a crystal orientation adjustment apparatus.

9. The quantum sensor according to claim 1, wherein the quantum sensor comprises a light path allowing excitation light for Raman scattering to pass through the rare-earth-ion doped optical crystal twice.

10. Use of the quantum sensor according to claim 1 for magnetic field sensing or electric field sensing.

11. A method for performing electric field sensing by using the quantum sensor according to claim 1, comprising:
applying a constant magnetic field to the rare-earth-ion doped optical crystal by using the constant magnetic field generation unit,
applying a temperature of 1 K to 15 K to the rare-earth-ion doped optical crystal by using the low temperature providing unit,
applying a pumping light field to the rare-earth-ion doped optical crystal by using the light field generation unit so as to prepare rare-earth-ions in an initial spin state,
placing the rare-earth-ion doped optical crystal in an electric field to be measured,
generating a spin echo of the rare-earth-ions by using the pulsed magnetic field generation unit,
applying a light field to the rare-earth-ion doped optical crystal by using the light field generation unit so that Raman scattering of the rare-earth-ion doped optical crystal is excited, and
detecting and analyzing a Raman scattering light field radiated from the rare-earth-ion doped optical crystal by using the heterodyne Raman scattering light field detection and analysis unit, and calculating the electric field to be measured.

12. The method according to claim 11, wherein between the constant magnetic field and a zero first-order Zeeman effect point the direction error is 0.001 degrees or less and the intensity error is 0.005% or less.

13. A method for performing magnetic field sensing by using the quantum sensor according to claim 1, comprising:
applying a constant magnetic field to the rare-earth-ion doped optical crystal by using the constant magnetic field generation unit,
applying a temperature of 1 K to 15 K to the rare-earth-ion doped optical crystal by using the low temperature providing unit,
applying a pumping light field to the rare-earth-ion doped optical crystal by using the light field generation unit so as to prepare rare-earth-ions in an initial state,
placing the rare-earth-ion doped optical crystal in a magnetic field to be measured,
generating a spin echo of the rare-earth-ions by using the pulsed magnetic field generation unit,
applying a light field to the rare-earth-ion doped optical crystal by using the light field generation unit so that Raman scattering of the rare-earth-ion doped optical crystal is excited, and
detecting and analyzing a Raman scattering light field radiated from the rare-earth-ion doped optical crystal by using the heterodyne Raman scattering light field detection and analysis unit, and calculating the magnetic field to be measured.

14. The method according to claim 13, wherein the intensity of the constant magnetic field deviates from a zero first-order Zeeman effect point by 0.1% to 5%.

* * * * *